US012592359B2

(12) United States Patent
Murphy et al.

(10) Patent No.: US 12,592,359 B2
(45) Date of Patent: Mar. 31, 2026

(54) APPARATUS, SYSTEM AND METHOD FOR ENERGY SPREAD ION BEAM

(71) Applicant: Applied Materials, Inc., Santa Clara, CA (US)

(72) Inventors: Paul J. Murphy, Reading, MA (US); Frank Sinclair, Hartland, ME (US); Jun Lu, Beverly, MA (US); Daniel Tieger, Manchester, MA (US); Anthony Renau, West Newbury, MA (US)

(73) Assignee: Applied Materials, Inc., Santa Clara, CA (US)

( * ) Notice: Subject to any disclaimer, the term of this patent is extended or adjusted under 35 U.S.C. 154(b) by 375 days.

(21) Appl. No.: 18/478,826

(22) Filed: Sep. 29, 2023

(65) Prior Publication Data

US 2024/0029997 A1    Jan. 25, 2024

Related U.S. Application Data

(63) Continuation of application No. PCT/US2022/015959, filed on Feb. 10, 2022, which (Continued)

(51) Int. Cl.
*H01J 37/317*      (2006.01)
*C23C 14/48*       (2006.01)
(Continued)

(52) U.S. Cl.
CPC .......... *H01J 37/3171* (2013.01); *C23C 14/48* (2013.01); *H01J 37/05* (2013.01);
(Continued)

(58) Field of Classification Search
CPC ........ H01J 37/3171; H01J 37/05; H01J 37/08; H01J 37/304; H01J 37/32082; H01J 2237/24585
(Continued)

(56) References Cited

U.S. PATENT DOCUMENTS 5,504,341 A    4/1996  Glavish
6,229,148 B1   5/2001  Prall
(Continued)

FOREIGN PATENT DOCUMENTS

JP        H06324536 A     11/1994
JP        H08212956 A      8/1996
(Continued)

OTHER PUBLICATIONS

International Search Report and Written Opinion for Application No. PCT/US2022/015959 dated May 30, 2022.
(Continued)

*Primary Examiner* — Michael Maskell
(74) *Attorney, Agent, or Firm* — KDW, PLLC

(57) ABSTRACT

An ion implanter may include an ion source, arranged to generate a continuous ion beam, a DC acceleration system, to accelerate the continuous ion beam, as well as an AC linear accelerator to receive the continuous ion beam and to output a bunched ion beam. The ion implanter may also include an energy spreading electrode assembly, to receive the bunched ion beam and to apply an RF voltage between a plurality of electrodes of the energy spreading electrode assembly, along a local direction of propagation of the bunched ion beam.

9 Claims, 4 Drawing Sheets

Related U.S. Application Data is a continuation of application No. 17/221,033, filed on Apr. 2, 2021, now Pat. No. 11,569,063.

(51) Int. Cl.

| | |
|---|---|
| *H01J 37/05* | (2006.01) |
| *H01J 37/08* | (2006.01) |
| *H01J 37/30* | (2006.01) |
| *H01J 37/304* | (2006.01) |
| *H01J 37/32* | (2006.01) |
| *H01L 21/265* | (2006.01) |

(52) U.S. Cl.

CPC .......... *H01J 37/08* (2013.01); *H01J 37/3007* (2013.01); *H01J 37/304* (2013.01); *H01J 37/32082* (2013.01); *H01J 2237/24585* (2013.01); *H01L 21/265* (2013.01)

(58) Field of Classification Search

USPC ........................................... 250/492.1–492.3

See application file for complete search history.

(56) References Cited

U.S. PATENT DOCUMENTS

| | | | |
|---|---|---|---|
| 7,888,249 | B2 | 2/2011 | Bateman |
| 9,218,941 | B2 | 12/2015 | Jen |
| 10,128,084 | B1 | 11/2018 | Baggett |
| 11,728,132 | B2 * | 8/2023 | Yamaguchi ......... H01J 37/3171 |
| | | | 250/492.3 |
| 2004/0256578 | A1 * | 12/2004 | Mitchell ............ H01J 37/3171 |
| | | | 250/492.21 |
| 2006/0208203 | A1 | 9/2006 | Gupta |
| 2015/0200073 | A1 | 7/2015 | Jen |
| 2019/0066977 | A1 | 2/2019 | Jelinek |
| 2019/0157035 | A1 | 5/2019 | Sasaki |
| 2019/0371562 | A1 | 12/2019 | Sinclair |

FOREIGN PATENT DOCUMENTS

| | | | |
|---|---|---|---|
| JP | 2014232671 | A | 12/2014 |
| JP | 2017510023 | A | 4/2017 |
| KR | 1020090029209 | A | 3/2009 |
| TW | I604760 | B | 11/2017 |
| WO | 9908306 | A1 | 2/1999 |
| WO | 2017174597 | A1 | 10/2017 |
| WO | 2020229638 | A2 | 11/2020 |

OTHER PUBLICATIONS

Amemiya et al., "Development of a continuously variable energy radio frequency quadrupole accelerator for SiC power semiconductor device fabrication," Nuclear Instruments and Methods in Physics Research Section B: Beam Interactions with Materials and Atoms, vol. 188, Issues 1-4: 247-250 (Apr. 2002) <doi: 10.1016/S0168-583X(01)01107-7 >.

* cited by examiner

APPARATUS, SYSTEM AND METHOD FOR ENERGY SPREAD ION BEAM

CROSS-REFERENCE TO RELATED APPLICATIONS

This application is a continuation of International Application No. PCT/US22/15959, filed on Feb. 10, 2022, which claims the benefit of priority to U.S. application Ser. No. 17/221,033, filed on Apr. 2, 2021, which applications are incorporated by reference herein in their entirety.

FIELD OF THE DISCLOSURE

The disclosure relates generally to ion implantation apparatus and more particularly to high energy beamline ion implanters.

BACKGROUND OF THE DISCLOSURE

In the present day, certain devices such as Insulated Gate Bipolar Transistors (IGBTs), CMOS image sensors, and other semiconductor devices, are fabricated using multiple ion implants. The use of multiple ion implants facilitates the generation of smooth dopant profiles having a targeted shape as a function of depth within the semiconductor substrate, which approach is especially useful for relatively deep ion implantation profiles. In current practice, this targeted shape may be achieved by implanting relatively small doses of ions at many different ion energies. The current state of the art for CMOS Image Sensors (CIS) devices, for example, may employ 20 discrete energies ranging from 500 keV to more than 10 MeV, with doses ranging from 1E10 to 1E12/cm$^2$, while for shorter wavelength sensing needed for automotive and other applications, the number of implantation steps may double or be even higher.

Rather than employ multiple implants, the use of a sawtooth absorbing filter has been proposed to generate a spread of ion energies within a given ion implantation operation. However, this approach has attendant risks of contamination, particles and filter life that may limit such an approach for a practical production environment.

With respect to these and other considerations, the present disclosure is provided.

BRIEF SUMMARY (TO BE COMPLETED)

In one embodiment, an ion implanter may include an ion source, arranged to generate a continuous ion beam, a DC acceleration system, to accelerate the continuous ion beam, as well as an AC linear accelerator to receive the continuous ion beam and to output a bunched ion beam. The ion implanter may also include an energy spreading electrode assembly, to receive the bunched ion beam and to apply an RF voltage between a plurality of electrodes of the energy spreading electrode assembly, along a local direction of propagation of the bunched ion beam.

In another embodiment, an ion implanter is provided, including an ion source to generate an ion beam as a continuous ion beam, and a linear accelerator to bunch the continuous ion beam and output the ion beam as a bunched ion beam. The ion implanter may include a scanner, arranged to receive the bunched ion beam, propagating along a first direction, and to scan the bunched ion beam along a second direction, perpendicular to the first direction. The ion implanter may further include a collimator, disposed downstream to the scanner, to receive the bunched ion beam, and output the bunched ion beam as a ribbon beam. The ion implanter may also include an energy spreading electrode assembly, disposed downstream to the linear accelerator, and arranged to apply an AC voltage between a plurality of electrodes of the energy spreading electrode assembly, along a local direction of propagation of the ribbon beam.

In an additional embodiment, a beam conditioning apparatus may include a scanner, arranged to receive a bunched ion beam, propagating along a first direction, and to scan the ion beam along a second direction, perpendicular to the first direction. The beam conditioning apparatus may also include a collimator, disposed downstream to the scanner, to receive the bunched ion beam, and output the bunched ion beam as a ribbon beam. The beam conditioning apparatus may further include an energy spreading electrode assembly, disposed downstream to the linear accelerator, and arranged to apply an AC voltage between a plurality of electrodes of the energy spreading electrode assembly, along a local direction of propagation of the ribbon beam. The beam conditioning apparatus may additionally include a controller, arranged to control the scanner and the energy spreading electrode assembly to generate a uniform energy spreading of the ribbon beam, across a width of the ribbon beam, along a direction, perpendicular to the local direction of propagation of the ribbon beam.

Figure 1:
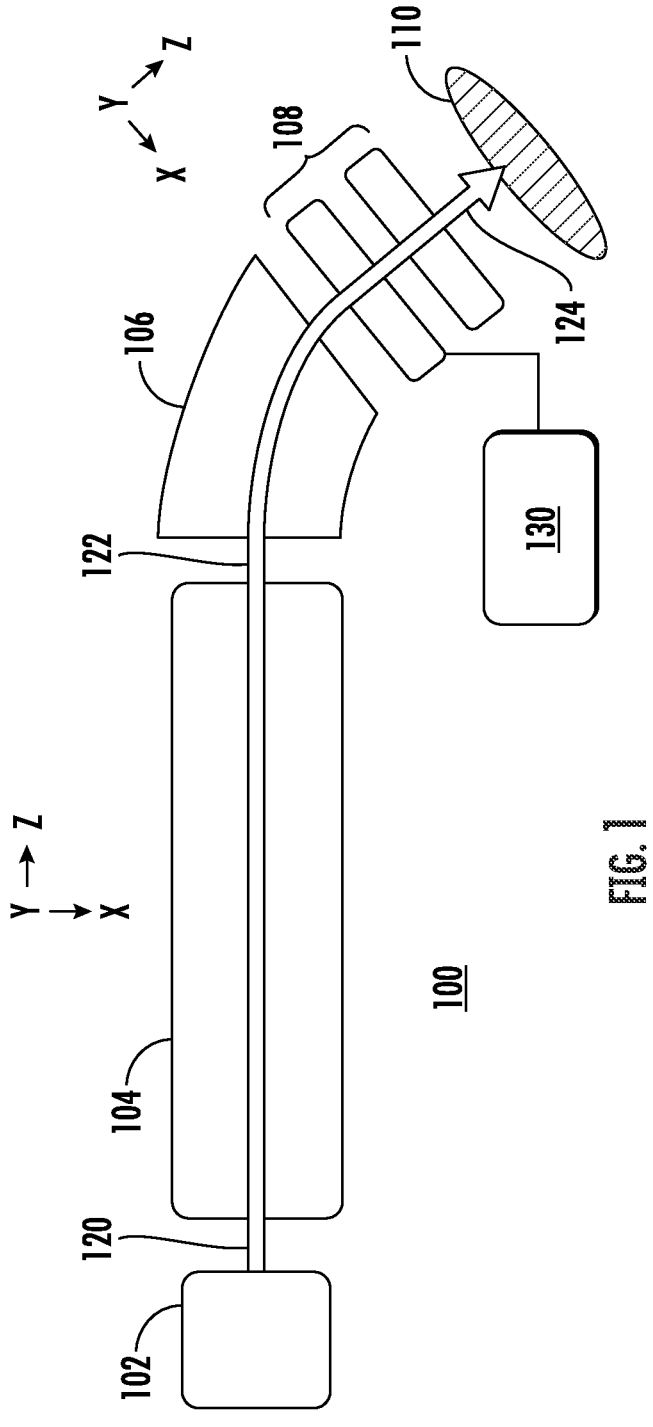
FIG. 1 depicts an ion implanter, in accordance with embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment"

of the present disclosure are not intended to be interpreted as precluding the existence of additional embodiments also incorporating the recited features.

Provided herein are approaches for improved ion implantation systems and components, based upon a beamline architecture, and in particular, high energy ion implanters, such as ion implanters based upon linear accelerators. For brevity, an ion implantation system may also be referred to herein as an "ion implanter." Various embodiments entail novel approaches that generate bunched ribbon ion beams for processing in a linear accelerator or LINAC.

In various embodiments, an electrode assembly is provided downstream of a LINAC to modify the energy of a bunched ion beam using an AC signal that is delivered to the electrode assembly at a high frequency. In various embodiments where scanning of a substrate and/or ion beam is performed to process the substrate, the frequency of the energy variation may be set much faster than the scanning of the substrate, so that the energy variation generated by the electrode assembly appears at each point on the substrate as a controlled, repeatable energy spread.

FIG. 1 depicts an ion implanter 100, in accordance with embodiments of the disclosure. The ion implanter 100 includes an ion source 102, arranged to generate a continuous ion beam, shown as ion beam 120. The ion implanter 100 may include an AC linear accelerator, denoted as linear accelerator 104, disposed downstream of the ion source 102, to receive the ion beam 120. The linear accelerator 104 may include a buncher (not separately shown) as known in the art, in order to modify the ion beam 120 so that a bunched ion beam 122 is generated. At a plurality of stages of the linear accelerator 104, the energy of the bunched ion beam 122 may be increased to targeted ion energy, such as 1 MeV, 2 MeV, 5 MeV or other suitable ion energy, according to various non-limiting embodiments.

In accordance with some non-limiting embodiments of the disclosure, the ion implanter 100 may include additional components, disposed downstream to the linear accelerator 104, to shape, collimate, filter, or scan the bunched ion beam 122, or perform any combination these operations. These additional components are illustrated by downstream component 106, which component is disposed intermediate between the linear accelerator 104 and an energy spreading electrode assembly 108. The energy spreading electrode assembly 108 is arranged to receive the bunched ion beam 122 and to modulate the energy of the bunched ion beam 122, to output an energy spread ion beam 124 to a substrate 110.

In various embodiments, the energy of the bunched ion beam 122 may be modulated by applying a high frequency voltage across the energy spreading electrode assembly 108, which voltage may generate a corresponding high frequency electric field along a direction of propagation of the bunched ion beam 122, represented as the Z-axis in the Cartesian coordinate system shown. In particular, in this embodiment and other embodiments to follow, the energy spreading electrode assembly 108 may be arranged as hollow electrodes that conduct the bunched ion beam 122, while applying a high frequency field along the direction of propagation. In this manner, a variable energy may be imparted to the bunched ion beam 122 during traversal through the energy spreading electrode assembly. For example, an RF power source 130 may be employed to generate an AC voltage signal (the terms "AC voltage" or "AC voltage signal" as used herein may encompass any suitable frequency range, including 1 kHz, 1 MHz, and so forth) between different electrodes within the energy spreading electrode assembly 108 at a suitable frequency, such a greater than 1 MHz. Examples of appropriate acceleration frequency to drive the acceleration stages of a linear accelerator as well as the energy spreading electrode assembly 108 include frequencies between 13.56 MHz and 40 MHz in various non-limiting embodiments.

In accordance with various embodiments of the disclosure, the AC voltage delivered to the energy spreading electrode assembly 108 may have a suitable amplitude to generate a targeted energy spread within the energy spread ion beam 124 as delivered to the substrate 110. For example, according to some non-limiting embodiments, the energy spread ion beam 124 may have an energy distribution having a full width at half maximum (FWHM) equivalent to 1% nominal ion beam energy, 2% nominal energy, 5% nominal energy, 10% nominal energy, or 20% nominal energy. As such, the nominal ion beam energy may be greater than 500 keV, greater than 1 MeV, greater than 2 MeV, greater than 5 MeV in different embodiments. In this manner, for a given nominal ion beam energy, the energy spread ion beam 124 may implant into the substrate 110 in a manner that delivers a broader implant profile in comparison to the implant profile generated by a monoenergetic ion beam having the same nominal ion beam energy.

Figure 2:
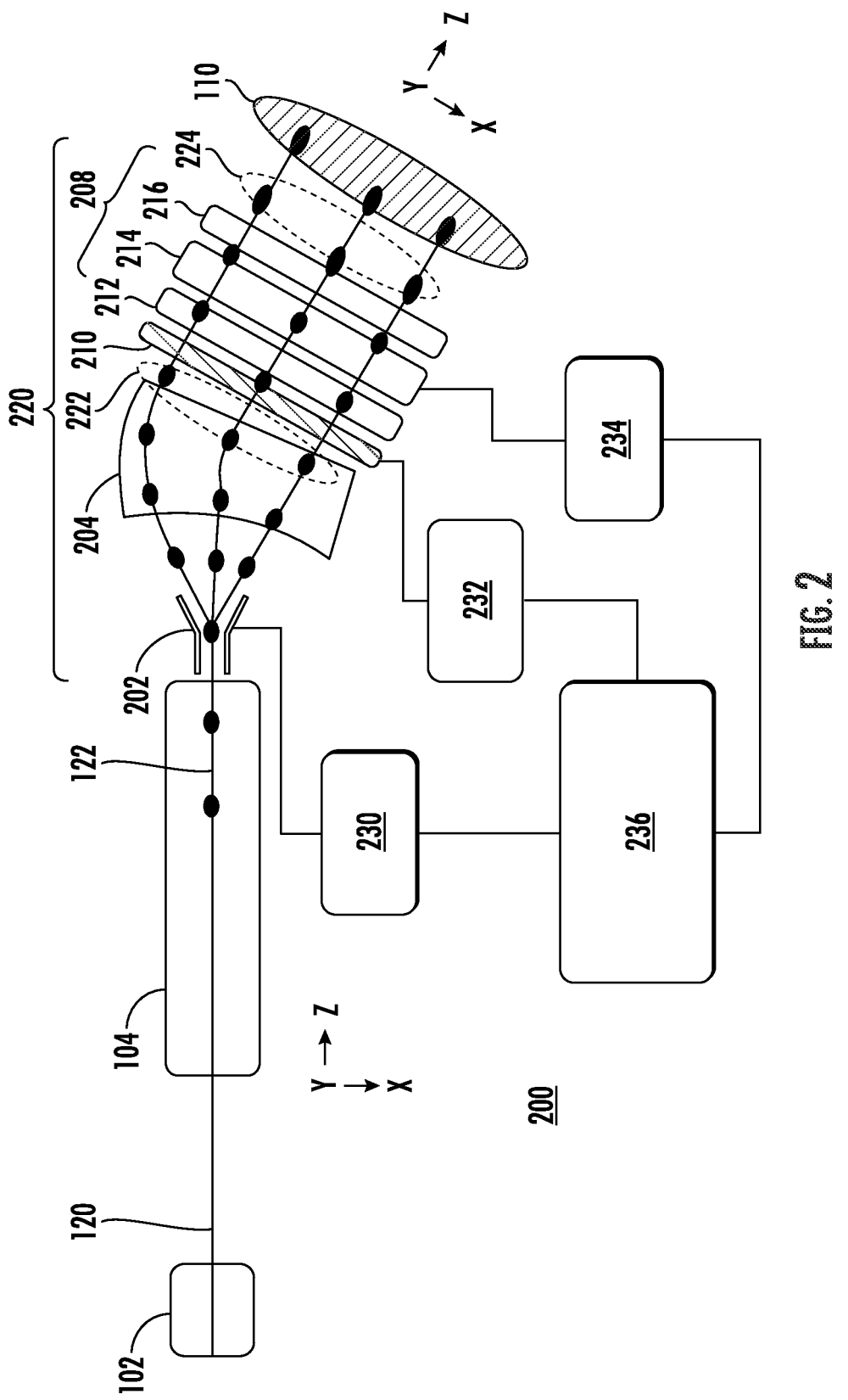
FIG. 2 shows another exemplary ion implanter, according to embodiments of the disclosure.

FIG. 2 depicts an ion implanter 200, in accordance with additional embodiments of the disclosure. As in the case of ion implanter 100, the ion implanter 200 includes an ion source 102, and a linear accelerator 104, disposed downstream of the ion source 102.

The ion implanter 200 may include a beam conditioning apparatus 220, disposed downstream to the linear accelerator 104, and including a scanner 202, collimator 204, and energy spreading electrode assembly 208.

The linear accelerator 104 may include a buncher (not shown) to generate a bunched ion beam 122 from the ion beam 120, which beam may enter the linear accelerator 104 as a continuous ion beam. The scanner 202 is arranged to receive the bunched ion beam 122 (shown schematically as ion bunches represented by the dark ovals), and arranged to deliver a scan signal, defined by a scan period, to scan the bunched ion beam 122 between a first beamline side and a second beamline side. In this example, the bunched ion beam 122 may be a pencil or spot ion beam, where the bunched ion beam 122 is scanned in the X-Z plane as shown. For example, a scan generator 230 may deliver a scan signal, such as an oscillating voltage, to a pair of electrode plates that generate an oscillating electric field at a scan frequency in the kHz range, such as 1 kHz, 2 kHz, 5 kHz, according to some non-limiting embodiments. As such, the scanned bunched ion beam may fan out to form an elongated cross-section along the X-axis, when averaged over a time scale longer than the period of the scan generator 230 for a given scan frequency. In this embodiment, the energy spreading electrode assembly 208 includes a series of AC electrodes coupled to a phase control system that uses the information of the scan position of the bunched ion beam 122 in order to select the appropriate phase so as to achieve a desired energy spread for the bunched ion beam 122.

The collimator 204 is disposed downstream to the scanner 202, to receive the bunched ion beam 122, in this case in the form of fanned out beam. The collimator 204 may be arranged to shape and output the bunched ion beam 122 as a ribbon beam 222, elongated along the X-axis. As further shown in FIG. 2, the energy spreading electrode assembly 208 is disposed downstream to the collimator 204, to receive the ribbon beam 222. As detailed below, the energy spreading electrode assembly 208 is arranged to apply an RF voltage between a plurality of electrodes, along a direction of propagation of the ribbon beam, in order to generate an energy spread therein.

In the example of FIG. 2, the energy spreading electrode assembly 208 includes a first ground electrode 212 and second ground electrode 216, with a powered electrode 214, disposed between the two ground electrodes. An RF power supply 234 may supply an RF power signal to the powered electrode 214, at suitable frequency. For example, the RF power supply 234 may direct an RF signal to a resonator (not separately shown) that delivers and RF voltage signal to the powered electrode 214. As such, an RF voltage will develop between the powered electrode 214 and the first ground electrode 212 and second ground electrode 216, where the RF voltage generates an oscillating electric field along the Z-axis in the direction of propagation of the ribbon beam 222, having a frequency corresponding to the frequency of the RF voltage signal.

According to various embodiments of the disclosure, the energy spreading electrode assembly 208 may be arranged as a series of hollow conductive cylinders having an elongated cross-section (along the X-axis) designed to encompass the ribbon beam 222. In this manner, the energy spreading electrode assembly 208 may exhibit some features of a known drift tube assembly used for bunching or accelerating an ion beam in a linear accelerator. As the ribbon beam 222 traverses a given hollow electrode of the energy spreading electrode assembly, the ribbon beam 222 will experience a drift region within the hollow electrode where no electric field is present. An oscillating electric field will develop between the first ground electrode 212 and powered electrode 214, while an oscillating electric field will also develop between the powered electrode 214 and the second ground electrode 216. In this manner, the energy spreading electrode assembly 208 may define a so-called double gap configuration characterized by two accelerating gaps. According to various embodiments of the disclosure, to have the desired effect of spreading the ion energy, the frequency and phase of the oscillating voltage applied to the energy spreading electrode assembly 208 is selected in consideration of several factors. These factors include the velocity of the ions, the spread of phases in the ion bunch and the length between the two gaps of the double gap configuration.

As the ribbon beam 222 enters an accelerating gap in the energy spreading electrode assembly 208, the timing of the entry of a given ion bunch of the ribbon beam 222 will influence how ions are accelerated or decelerated across the gap. For example, a sinusoidal RF voltage signal may be applied to the powered electrode 214, where a sinusoidal electric field develops across the accelerating gap. Depending upon the instantaneous amplitude and sign of the electric field as an ion crosses the accelerating gap, the ion may be accelerated or decelerated, to a lesser or greater extent. Thus, within a given ion bunch that traverses the accelerating gap, ions on the leading edge of the bunch will be accelerated or decelerated to a different extent than ions on the trailing edge of the bunch, leading a spreading of ion energy of the ribbon beam 222 during traversal through the energy spreading electrode assembly 208.

According to embodiments of the disclosure, the energy spreading electrode assembly 208 may broaden or spread the energy of the ribbon beam 222 by a targeted amount in order to deliver an energy spread ion beam 224 (shown as dark ovals that are more elongated to indicate energy spreading) to the substrate 110, having a desired range of ion energies. For example, in one scenario, the linear accelerator 104 may impart an ion energy of 1 MeV to the ribbon beam 222, while an RF voltage signal having an amplitude of 80 keV is delivered to the powered electrode 214. Assuming an initially monoenergetic energy for ribbon beam 222, the 80 kV signal may cause the energy spread ion beam 224 to strike the substrate 110 with an average energy of 1 MeV and a FWHM of up to 160 keV.

According to various non-limiting embodiments of the disclosure, an energy spreading electrode assembly may process an ion beam to spread the ion energy (FWHM) by 1% to 30% for initial ion energies in the range of 1 Me to 10 MeV. Note that as discussed above, the ribbon beam 222 will enter the energy spreading electrode assembly as a bunched ion beam, meaning a discrete series of ion packets or bunches, that are separated in time and space from one another. This bunching is accomplished by drift tube apparatus that may perform in a manner similar to the operation of the energy spreading electrode assembly 108, where an RF signal is applied to at least one powered electrode in a series of drift tube electrodes. These drift tube assemblies of a buncher will generate two or more accelerating gaps that tend to differentially accelerate/decelerate different ions in an ion beam depending the timing of when the different ions traverse an accelerating gap as RF field oscillates across the accelerating gap. Moreover, according to various embodiments of the disclosure, the bunched ion beam (ribbon beam 222) may be bunched at a bunch frequency, that is equal to a spreading frequency output by the RF power supply 234. In this manner, the timing of the arrival of ion bunches of the ribbon beam 222 may be synchronized with the electric field generated across the energy spreading electrode assembly 208.

In particular embodiments, where the spreading frequency (e.g., on the order of MHz or tens of MHz) of energy spreading electrode assembly 208 may be much faster than the scan frequency of scanner 202 (e.g., on the order of 1 kHz or so), the energy spread may be imparted to the different bunches of the energy spread ion beam 224 in a uniform, repeatable fashion. For example, while the ribbon beam 222 is elongated along a lateral direction (X-axis), perpendicular to the direction of propagation (Z-axis), the energy spreading electrode assembly 208 may apply a uniform energy spread to the bunched ribbon beam (ribbon beam 222) for the different ion bunches across a width of the bunched ribbon beam along the X-axis. This uniformity of energy spread may be accomplished by maintaining a constant phase relationship of an RF signal output by the RF power supply 234 to the energy spreading electrode assembly 208 and the time of arrival of the bunches in the ribbon beam.

In one embodiment, the ion implanter 200 may include a detector 210 and a phase measurement component 232 to measure the phase of the ion bunches of the ribbon beam 222 an entrance to the energy spreading electrode assembly 208. The ion implanter 200 may further include a controller 236 to synchronize this phase information with the RF power supply 234, as shown in FIG. 2. Alternatively, the controller 236 may retrieve or receive signals from the scan generator 230 to determine the instantaneous scan position (along the X-axis) of an ion bunch of the ribbon beam 222. Knowledge of the instantaneous scan position of an ion bunch will allow synchronization of an RF signal generated by the RF power supply 234 to ensure the given ion bunch traverses the energy spreading electrode assembly 208 at the proper interval to generate a targeted energy spread.

Figure 3:
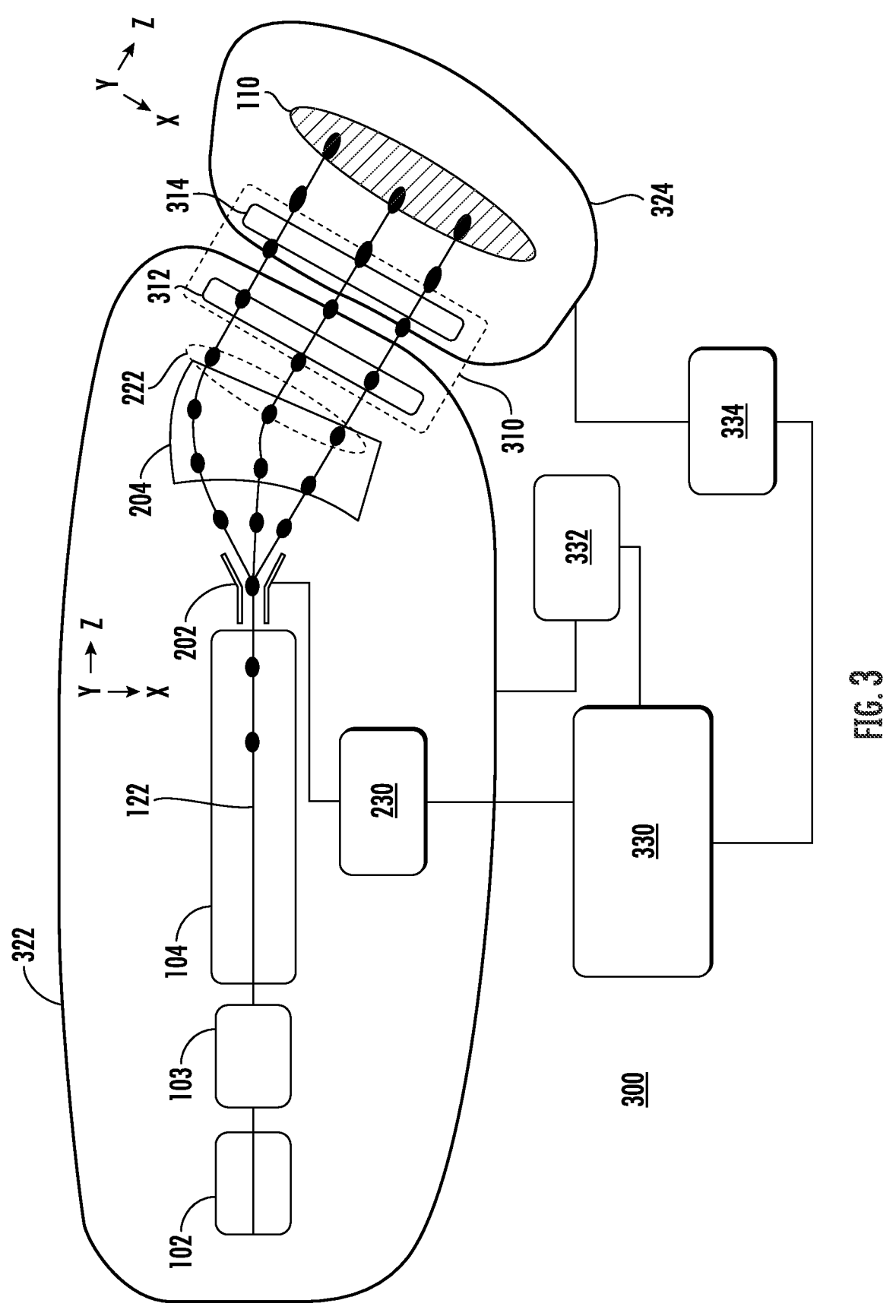
FIG. 3 depicts an ion implanter, arranged in accordance with further embodiments of the disclosure.

FIG. 3 depicts an ion implanter 300, arranged in accordance with further embodiments of the disclosure. As in the case of ion implanter 100, and ion implanter 200 the ion implanter 300 includes an ion source 102, and a linear accelerator 104, disposed downstream of the ion source 102. In this embodiment (as well as in variants of the embodiments of FIGS. 1, 2, and 4) the ion implanter may further include a DC acceleration system 103, to accelerate the ion beam 120 to a suitable energy, such as 250 keV to 500 keV according to some non-limiting embodiments, before further acceleration of the ion beam takes place in the linear accelerator 104.

In this embodiment, an energy spreading apparatus may include power supplies that are coupled to an energy spreading electrode assembly 310, in this case, embodied as a diode set, including an upstream electrode 312 and a downstream electrode 314. According to some embodiments an AC voltage may be applied between the upstream electrode 312 and downstream electrode 314. As shown in FIG. 3, an upstream portion 322 of the beamline is electrically isolated from a downstream portion 324 of the beamline. According to different embodiments, the upstream portion 322 of the beamline may be electrically floated or the downstream portion 324 may be electrically floated, including an endstation (not shown) housing the substrate 110. An advantage of this approach is that in this example, the energy spreading electrode assembly 310 does not need to receive an RF voltage signal that is set to the same frequency as the RF voltage applied to the linear accelerator 104. The embodiment in FIG. 3 is simpler in some aspects than the embodiment of FIG. 2, because there is just one gap in the energy spreading electrode assembly 310, and the frequency of energy oscillation can be chosen freely over a fairly wide range without causing other issues. However, the embodiment of FIG. 3 presents a more complicated mechanical design, requiring the separation of a large assembly from ground potential and mounting the assembly on insulators.

In embodiments were an AC voltage is applied between the upstream electrode 312 and downstream electrode 314, in order to avoid aliasing the AC voltage with the scan frequency and/or the bunching frequency of RF voltage applied to the linear accelerator 104 (including a buncher), the AC voltage frequency should be selected with care. Since the bunching frequency applied at the stages of the linear accelerator 104 is assumed to be several MHz or greater, and a scan frequency for scanner 202 may be in the range of ~1 kHz, according to some embodiments, an AC voltage frequency in the range of ~100 kHz, such as 50 kHz to 500 kHz, may be employed for the energy spreading electrode assembly 310. As shown in the embodiment of FIG. 3, a first power supply 332 is coupled to the upstream portion 322, or alternatively a power supply 334 could be coupled to the downstream portion 324, where each power supply may be coupled to a controller 330. Since this latter frequency may be much lower (~10× or more) than the bunching frequency of the linear accelerator 104, each bunch of ions passing through the energy spreading electrode assembly 310 will experience essentially a DC acceleration or deceleration. Said differently, for an ion bunch that is bunched at a frequency of say 13.56 MHz, the bunch length and therefore the travel time of the ion bunch through the energy spreading electrode assembly 310 is sufficiently short that the effective field experienced by that bunch will appear quasi-constant, due to the much lower energy spreading field frequency (~100 kHz).

Figure 4:
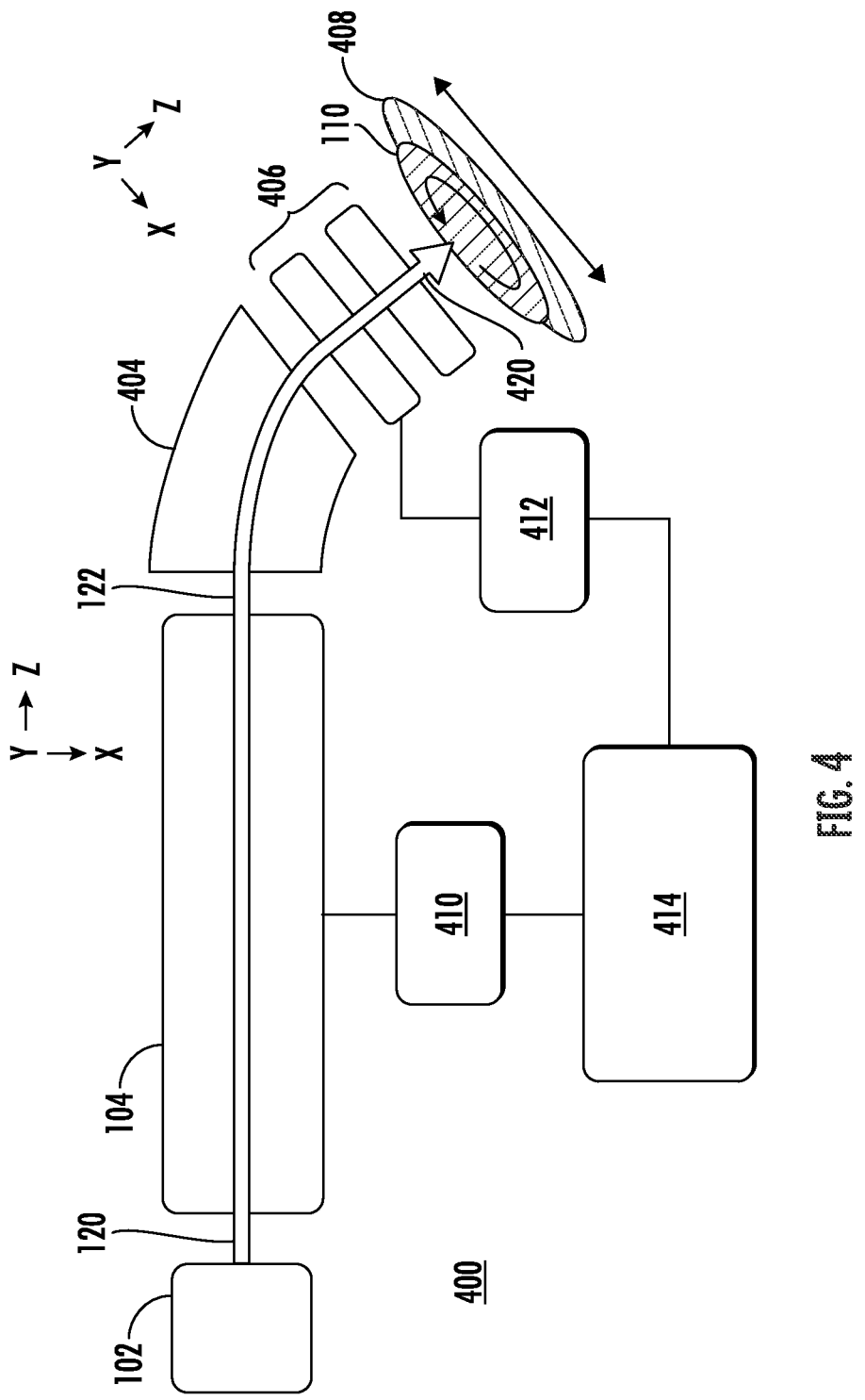
FIG. 4 depicts an ion implanter arranged in accordance with further embodiments of the disclosure.

FIG. 4 depicts an ion implanter 400, arranged in accordance with further embodiments of the disclosure. As in the case of ion implanter 100, ion implanter 200, and ion implanter 300, the ion implanter 300 includes an ion source 102, and a linear accelerator 104, disposed downstream of the ion source 102. Differing from the embodiments of FIG. 2 and FIG. 3, in this embodiment, the ion implanter 400 generates and directs a pencil beam (or spot beam) to the substrate 110.

As in the aforementioned embodiments, a plurality of stages of the linear accelerator 104 may generate and accelerate a bunched ion beam 122 to a targeted ion energy, such as 1 MeV, 2 MeV, 5 MeV or other suitable ion energy, according to various non-limiting embodiments. Differently from the aforementioned embodiments, a component such as an energy selector magnet 404 may be provided to process the bunched ion beam 122 as a spot beam having an ion energy at a targeted value, before striking the substrate 110. The energy selector magnet 404 (sometimes termed a "final energy magnet") serves to give an independent measurement of the energy of the ions at that point in the beamline. The ion implanter 400 further provides an energy spreading apparatus embodied as a high frequency power supply 412, and an energy spreading electrode assembly 406. For simplicity, the energy spreading electrode assembly 406 is shown as two electrodes. However, according to different embodiments, the energy spreading electrode assembly 406 may be embodied as a double gap drift tube assembly, similarly to energy spreading electrode assembly 208, or alternatively, as a triple gap electrode assembly where two powered electrodes are provided between two ground electrodes. As such, the high frequency power supply 412 may generate an RF voltage at the same frequency as power supply assembly 410 provides RF voltage to the buncher and various stages of the linear accelerator 104. An advantage of the architecture of FIG. 4 is that since the path length of ions in bunched ion beam 122 from the linear accelerator to the energy spreading electrode assembly 406 is constant, the phase relationship between the two is also constant. To achieve a desired and repeatable acceleration or deceleration of a series of ion bunches the phase of an accelerating or decelerating AC field is required to match the arrival time of the ion bunches that on the AC field is acting upon. In other words, each successive ion bunch arriving at the energy spreading electrode assembly 406 should experience the same amplitude and phase of the applied AC field. Accordingly, by establishing a same frequency of a bunching signal generated by the power supply assembly 410 and a spreading signal sent by the high frequency power supply 412, and by proper synchronization of the bunching signal and spreading signal, each successive ion bunch along a given ion path will be treated by the applied AC field from the energy spreading electrode assembly in the same manner. In the configuration of FIG. 2, this phase relationship varies as the path length for different ion paths varies according to the scan angle at that moment in time, while in the configuration of FIG. 4 there is no high speed scanning that varies the path length. Accordingly, the controller 414 may more easily synchronize acceleration of the bunched ion beam 122 through the linear accelerator 104 and the energy spreading performed by the energy spreading electrode assembly 406.

As shown in FIG. 4, the ion implanter 400 may include a substrate stage 408, configured to rotate the substrate 110 about the Z-axis, as well as translate the substrate along a perpendicular axis, such as the X-axis. In this manner, while the bunched ion beam 122 may expose just a portion of the substrate 110 at a given instance, an entirety of the substrate 110 or any targeted portion thereof, may be exposed to the energy spread ion beam 420, by suitable rotation and/or translation of the substrate 110.

In view of the foregoing, at least the following advantages are achieved by the embodiments disclosed herein. A first advantage afforded by ion implanters of the present embodiments is the ability to achieve a broader implant profile within a given implantation process than is possible using known monoenergetic high energy implanters. A further advantage is the ability to readily tune the breadth of an implant profile merely by adjusting voltage applied to an energy spreading component.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

What is claimed is:

1. An ion implanter, comprising:
an ion source arranged to generate an ion beam;
a scanner disposed downstream of the ion source in a direction of travel of the ion beam; and
an energy spreading electrode assembly disposed downstream of the scanner, to receive the ion beam and to apply a time varying voltage bias signal between a plurality of electrodes of the energy spreading electrode assembly to generate an energy spread of the ion beam.

2. The ion implanter of claim 1, wherein the energy spread is dependent on the time varying voltage bias signal.

3. The ion implanter of claim 1, wherein the energy spread provides a first implant profile in a substrate for a nominal ion energy that is broader than a second implant profile in the substrate that is generated when a monoenergetic ion beam of the same nominal energy is directed to the substrate.

4. The ion implanter of claim 1, where the energy spread has an energy distribution equal to 1% to 30% of an initial energy of the ion beam.

5. The ion implanter of claim 1, wherein the time varying voltage bias signal is an RF voltage.

6. The ion implanter of claim 1, wherein the time varying voltage bias signal is an AC voltage.

7. The ion implanter of claim 1, wherein the scanner is operative to scan the ion beam at a first frequency, and wherein the time varying voltage bias signal is applied at a second frequency, at least ten times greater than the first frequency.

8. The ion implanter of claim 7, wherein the ion beam is elongated along a lateral direction, perpendicular to a local direction of propagation of the ion beam, wherein the energy spreading electrode assembly is arranged to apply a uniform energy spread to the ion beam across a width of the ion beam along the lateral direction.

9. The ion implanter of claim 1, further comprising a linear accelerator, disposed between the ion source and the energy spreading electrode assembly, and arranged to increase an energy of the ion beam.

* * * * *